United States Patent
Howard et al.

(10) Patent No.: US 9,165,873 B1
(45) Date of Patent: Oct. 20, 2015

(54) SEMICONDUCTOR PACKAGE HAVING ETCHED FOIL CAPACITOR INTEGRATED INTO LEADFRAME

(71) Applicant: Texas Instruments Incorporated, Dallas, TX (US)

(72) Inventors: Gregory E. Howard, Plano, TX (US); Bernardo Gallegos, McKinney, TX (US); Rajiv Dunne, San Diego, CA (US); Darvin R. Edwards, Garland, TX (US); Siva P. Gurrum, Allen, TX (US); Manu J. Prakuzhy, Allen, TX (US); Donald C. Abbott, Chartley, MA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/494,916

(22) Filed: Sep. 24, 2014

Related U.S. Application Data

(63) Continuation-in-part of application No. 14/444,370, filed on Jul. 28, 2014.

(51) Int. Cl.
*H01L 23/02* (2006.01)
*H01L 23/495* (2006.01)

(52) U.S. Cl.
CPC .... *H01L 23/49589* (2013.01); *H01L 23/49582* (2013.01)

(58) Field of Classification Search
CPC ............ H01L 2224/48091; H01L 2924/01079
USPC .................................. 257/678; 438/107, 110
See application file for complete search history.

(56) References Cited

U.S. PATENT DOCUMENTS

| | | | |
|---|---|---|---|
| 6,368,363 B1 * | 4/2002 | Kobatake et al. ............ 29/25.03 |
| 6,510,045 B2 * | 1/2003 | Mido et al. ..................... 361/529 |
| 7,553,695 B2 * | 6/2009 | Shiv et al. ...................... 438/107 |
| 8,187,740 B2 * | 5/2012 | Nathan et al. .................. 429/129 |
| 2006/0210234 A1 * | 9/2006 | Shiv et al. ...................... 385/147 |
| 2009/0065767 A1 * | 3/2009 | Reynolds et al. ............... 257/40 |
| 2009/0114908 A1 * | 5/2009 | Hirai et al. ....................... 257/40 |
| 2009/0142656 A1 * | 6/2009 | Nathan et al. .................. 429/129 |

* cited by examiner

*Primary Examiner* — Jami M Valentine
(74) *Attorney, Agent, or Firm* — Steven A. Shaw; Frank D. Cimino

(57) ABSTRACT

A packaged semiconductor device including a leadframe made of a first metal, the leadframe including structures with surfaces and sidewalls; capacitors attached to surface portions of the leadframe structures, the capacitors having sidewalls coplanar with structure sidewalls; the capacitors including a foil of conductive material attached to the structure surface, the conductive material having pores covered by oxide and filled with conductive polymer, the capacitors topped by electrodes made of a second metal.

14 Claims, 6 Drawing Sheets

US 9,165,873 B1

SEMICONDUCTOR PACKAGE HAVING ETCHED FOIL CAPACITOR INTEGRATED INTO LEADFRAME

CROSS REFERENCE TO RELATED APPLICATION

This application is a continuation in part of and claims priority to U.S. patent application Ser. No. 14/444,370 filed on Jul. 28, 2014. Said application incorporated herein by reference.

FIELD

The present invention is related in general to the field of semiconductor devices and processes, and more specifically to the structure and fabrication method of semiconductor packages with leadframes, which start their fabrication process with etched foil capacitors so that an arbitrary number of these capacitors can be integrated into a package.

DESCRIPTION OF RELATED ART

Among the components of electronic systems assembled on printed circuit boards are typically capacitors of various sizes. To save board space and reduce parasitics, these capacitors are often placed as piece parts in tight proximity to other board components such as transistors and inductors. Driven by the relentless trend to conserve board real estate and minimize parasitic resistances, these capacitors are sometimes placed under or on top of other components.

As an examples of an additional step to advance conservation, stacked chip power MOSFETs have recently been proposed, which integrate a capacitor into the package of the device. Other semiconductor devices in Quad Flat No-Lead (QFN) and Small Outline No-Lead (SON) packages also are beginning to employ capacitors as piece parts inside the semiconductor package. In most cases, the semiconductor package offers only enough space for a single capacitor unit, for example in a 32 pin, 0.5 mm pitch, wire-bonded and molded 4×4×1 mm QFN package with a 200 µm thick leadframe.

To increase the obtainable value of capacitance per area by at least one order of magnitude, capacitors have recently been demonstrated based on the concept of folding the third dimension into the area of two dimensions: Cavities are etched into metal boards made for instance of aluminum, the aluminum surface in the cavities is then oxidized, and the cavities are filled with a conductive material such as a polymeric compound. After applying contact to the conductive compound, the three-dimensional capacitor offers a high capacitance value.

SUMMARY

Applicants realized that the market trend for many products using semiconductor devices, especially those in small, leadframe-based packages such as QFN and SON, requires a plurality of capacitors in intimate proximity to the semiconductor device. However, the traditional fabrication flow to start with a strip of base metal (typically copper), then masking the strip to etch it for multiple leadframes, and finally processing the strip through the steps of attaching a chip, bonding the wire connections, molding the package, and singulating the device, leaves only the option of assembling one or few discrete capacitors inside the package, while a multitude of additional needed capacitors has to be placed as piece parts on the board in the neighborhood of the device. This approach accumulates parasitic resistances and cost.

Applicants solved the problem of integrating an arbitrary number of capacitors, even with high capacitance values, inside the package directly in the locations of electrical need, when they discovered a process flow which reverses the conventional process flow and simultaneously integrates the capacitors with the leadframe: In the first phase, foil capacitors are formed and patterned, and in the second phase, the leadframe is patterned. The capacitors may be formed from aluminum foil, and the leadframe may be copper; each of the package pins and wire bond zones may also be aluminum. The process steps of attaching the chip, wire bonding the electrical connections, overmolding chip, wires and capacitors, and singulating the device remain unchanged.

The process flow begins with an aluminum foil (about 200 µm thick) bonded to a strip of copper sheet. Pores are created in the aluminum by etching. A first mask placed on the porous aluminum leaves the areas of the future capacitors unprotected. Next, the unprotected surfaces are oxidized, the pores are filled with conductive polymeric compound, and a contact metal such as silver is deposited on the compound. After removing the first mask, the now freed-up aluminum is removed so that the underlying copper is exposed. A second mask placed on the strip defines a plurality of leadframes. After the copper portions left exposed by the second mask are removed, the second mask is removed again.

BRIEF DESCRIPTION OF THE DRAWINGS

FIG. 2 illustrates a sheet of conductive material bonded on a strip of a first metal, wherein pores are to be created in the conductive sheet.

FIG. 3 depicts a first mask on the sheet or porous conductive material, the mask leaving unprotected the areas of the capacitors-to-be-created.

FIG. 4 shows the steps of oxidizing the unprotected surfaces and then filling the pores with a conductive polymeric compound.

FIG. 5 shows the step of depositing a layer of a second metal on the conductive polymeric compound in the unprotected areas of the first mask.

FIG. 6 illustrates the un-oxidized conductive material after removing the first mask.

FIG. 7 depicts the first metal after removing the covering un-oxidized conductive material.

FIG. 8 shows a second mask placed on the strip, thereby defining a plurality of leadframes while protecting the capacitor areas.

FIG. 9 illustrates the plurality of leadframes after removing the portions of the first metal exposed by the second mask and removing the second mask.

FIG. 10 summarizes, for a unit of the strip, the process steps of attaching a semiconductor chip to the leadframe, spanning wires to connect the chip terminals to leads, and encapsulating chip and wires.

DETAILED DESCRIPTION OF THE PREFERRED EMBODIMENTS

Figure 1:
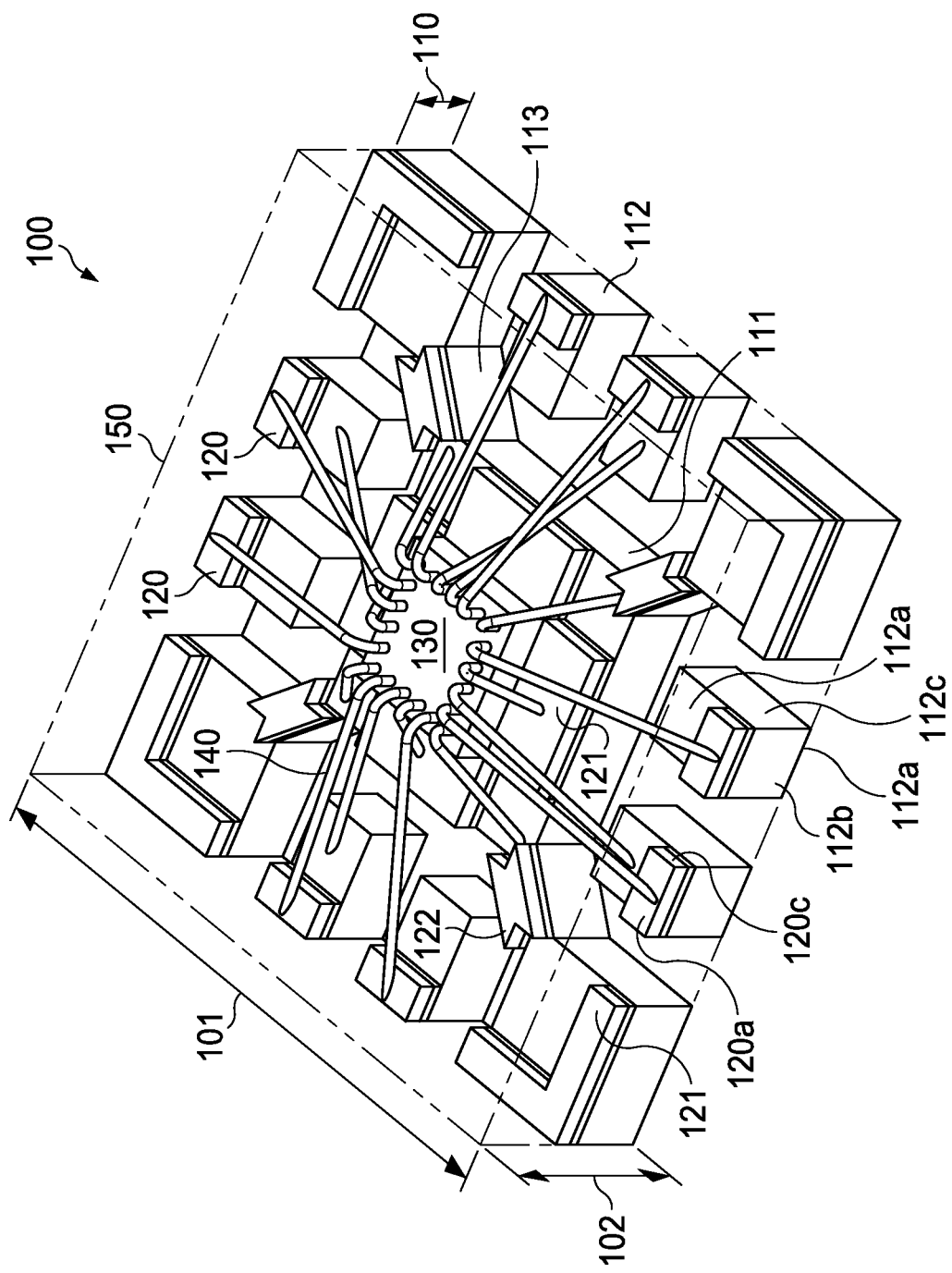
FIG. 1 is a perspective view of a QFN-type device according to the invention; the encapsulation compound is assumed to be transparent.

FIG. 1 illustrates an exemplary embodiment of the invention realized by a semiconductor device of the Quad Flat No-Lead (QFN) or Small Outline No-Lead (SON) family. It should be stressed, however, that the usage of etched foil capacitors according to the invention has applications not only in leadless devices but in a huge field of semiconductor devices and substrates. The exemplary embodiment of FIG. 1, generally designated 100, has square shape with a length of side 101 of 2 mm and a height 102 of the molded package of 0.5 mm. The package includes molding compound 150, which is preferably an epoxy-based thermoset compound with at least 80% inorganic fillers; for clarity and explanatory reasons, the molding compound in FIG. 1 is assumed to be transparent.

FIG. 1 shows inside the molded package a leadframe made preferably by etching from a strip of a first metal in the preferred range of thickness 110 from about 0.15 mm to 0.25 mm. Preferred metals include copper, copper alloys, aluminum, iron-nickel alloys, and Kovar™. The leadframe includes a chip pad 111 and a plurality of leads generally designated 112; chip pad 111 is coupled to leads by straps 113. Each of these structures has a surface and a plurality of sidewalls, some sidewalls are inside the package, other sidewalls may be at the package periphery. For instance, the pad designated 112A has a surface 112a and a sidewalls 112c inside the package and a sidewall 112b at the package periphery.

Bonded to the surfaces of portions of pad 111, leads 112, or straps 113 are one or more capacitors formed of geometrically shaped foils made of conductive material. In FIG. 1 the foil capacitors are generally designated 120; an example is the foil capacitor 120A bonded to the surface of lead 112A. As an example of the electrical characteristic of a foil capacitor, with an area of about 150 µm by 300 µm, a foil capacitor has a capacitance of about 25 nF. The conductive materials are preferably selected from a group comprising aluminum, tin, doped silicon, and doped germanium. The foil has a thickness preferably between about 40 and 60 µm. Among the preferred methods of bonding the foil of conductive material to the surfaces of the first metal are gluing with a conductive adhesive and electroless resistive welding; another method is growing the foil directly on the first metal surface by chemical vapor deposition. Processes to form foil capacitors 120 are discussed below. In the example of capacitor 120A, the size of the capacitor is about 150 µm×300 µm; it may cover only a portion of the available surface 112a of lead 112A; in other embodiments, it may cover all of the available surface area.

As FIG. 1 shows, certain sidewalls of the foil capacitors are coplanar with sidewalls of the bonded leadframe structure. As an example, the sidewall 120c of capacitor 120A is coplanar with sidewall 112c of lead 112A. The coplanarity of the sidewalls originates from the fabrication processes used in the manufacture of the leadframe and the capacitors; see below.

As mentioned, capacitors 120 belong to a class of capacitors made from a sheet made of conductive material such as aluminum in the thickness range from about 25 to 50 µm. The fabrication process of the capacitors starts by subjecting the sheet to a process involving abrasive ionic bombardment or selective chemical etching (for instance by hydroxide), in which a high number of irregularly shaped cavities or pores are created. In a follow-up process step, the surfaces of the porous conductive material, including the inside of the pores, are oxidized in order to create the insulating layer for the capacitor. The pores are then filled with a conductive polymeric compound. A thin graphite layer is placed on the polymer layer, and a thin layer of a second metal such as silver is deposited on the graphite layer as a capacitor electrode. The total thickness of the stacked layers of the foil capacitor is preferably between 50 and 70 µm. Foil capacitors as described can be commercially obtained by Kemet Company USA, Cresco, Pa.

FIG. 1 illustrates a technical advantage of using foil capacitors according to the invention. In addition to the capacitors 120 and the large capacitor 121, there are a plurality of capacitors with a variety of contours and in various positions of the leadframe; some of these capacitors are shown in FIG. 1 without wire connections. As an example, the leads in the package corners carry angularly shaped capacitors 121; as another example, the leadframe straps (which hold the chip pad to certain leads) have elongated capacitors 122. These additional capacitors may represent spare units ready to be contacted and integrated into the circuitry assembled in the package, when a different chip with more numerous bond pad needs to be assembled in an existing leadframe without wasting time in waiting for a freshly designed leadframe.

The exemplary embodiment of FIG. 1 further includes a chip pad of about 1 mm×1 mm area, onto which a semiconductor chip 130 is attached. Chip 130 has a plurality of bond pads; bonding wires 140 are attached to the bond pads to connect the chip terminals to the leadframe leads and the capacitors. Wires 140 may be made of copper, aluminum, or gold. In exemplary FIG. 1, chip 130 is itself mounted on top of a large capacitor 121 of 1 mm×1 mm area, from which the four corners have been removed for wire bonding reasons; each corner sized about 0.3 mm×0.3 mm (the corners allow stitch bonds to the first metal). In other embodiments, the chip is mounted directly onto the pad.

The placement technique shown in FIG. 1 illustrates the advantage of integrating an arbitrary number of capacitors simultaneously into a semiconductor package as foil capacitors. The advantage is brought about by the fabrication process in which the capacitors, already integrated with the leadframe metal, are processed in the earlier phases ahead of the leadframe definition and in the later phases in parallel with the leadframe processes. Significant steps of the joint process flow of foil capacitors integrated with leadframes are illustrated in FIGS. 2 to 10.

Figure 2:
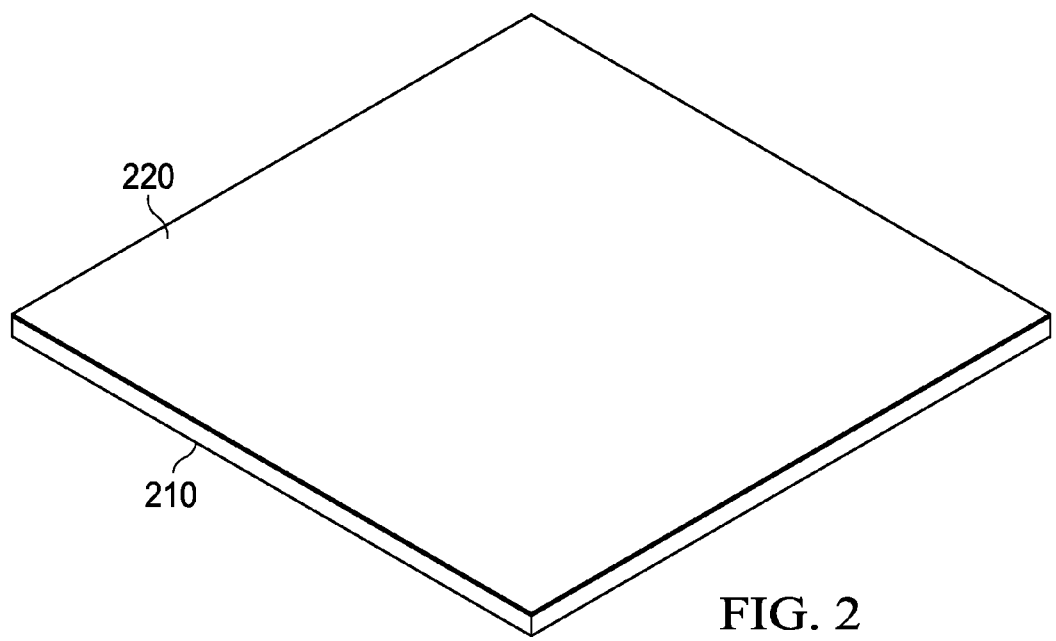
FIGS. 2 to 10 show steps of the process flow to fabricate a semiconductor package with an etched foil capacitor integrated into the leadframe.

FIG. 2 shows a foil 220 of a conductive material bonded on the flat surface of a strip 210 made of a first metal. Foil 220 has a preferred thickness between about 40 µm and 60 µm; as the starting material of the capacitors, the conductive material is preferably aluminum, other choices include tin, doped polycrystalline silicon and doped polycrystalline germanium. Strip 210 has a preferred thickness between about 150 µm and 250 µm; other embodiments may use thicker or thinner strips. Strip 210 is large enough to include a plurality of leadframes. As the starting metal of the leadframes, the first metal may be copper, copper alloy, aluminum, iron-nickel alloy, or Kovar™. Among the preferred methods of bonding the foil of conductive material to the surfaces of the first metal are gluing with a conductive adhesive and electroless resistive welding; another method is growing the foil directly on the first metal surface by chemical vapor deposition.

By the next process step, foil 220 is prepared so that a multitude of pores and cavities are created. A preferred method is selective chemical etching, for instance by hydroxide, another method includes abrasive ionic bombardment. The resulting porous metal has irregularly shaped cavities, indents and pores.

As an alternative method, the conductive material may be deposited on the first metal by plasma vapor deposition or a related process. Layers formed by such methods have been found to exhibit a multitude of pores and surface roughness useful for creating capacitors.

Figure 3:
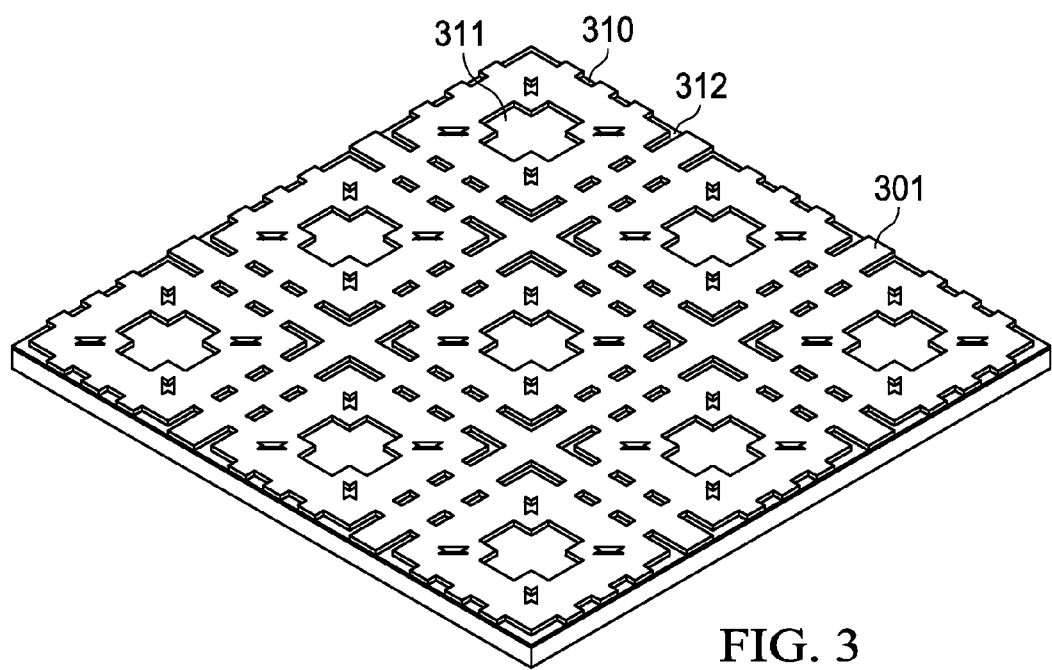

In the next process step, shown in FIG. 3, a first mask 301 is placed on the foil of porous conductive material. First mask 301 defines the areas of the capacitors. As FIG. 3 illustrates, the openings in mask 301 may define capacitors of a variety of different shapes, such as rectangles 310, crosses 311, angles 312, and circles.

Figure 4:
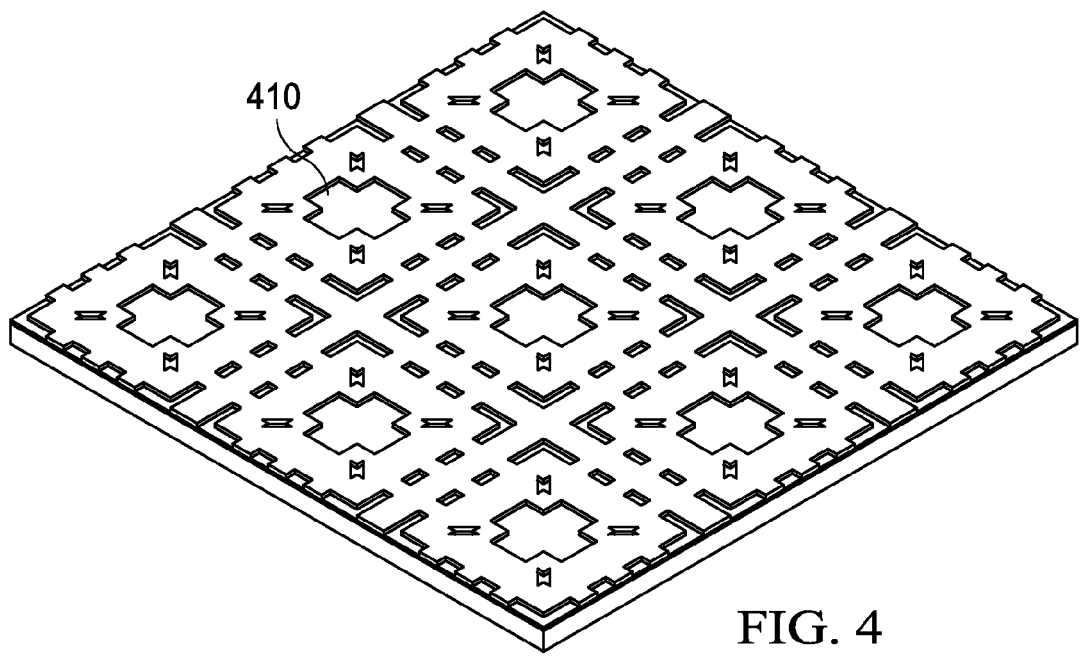

FIG. 4 summarizes the process step of oxidizing the surface of the conductive material including the surface inside of the pores, exposed by mask 301; and the step of filling the pores of the areas exposed by mask 301 with a conductive polymeric compound (examples are areas 410, 411, 412 in FIG. 4). The compound may form a layer over the conductive material with a thickness between about 20 μm to 40 μm. FIG. 4 indicates the conductive polymeric compound by dotting the compound-covered areas.

Figure 5:
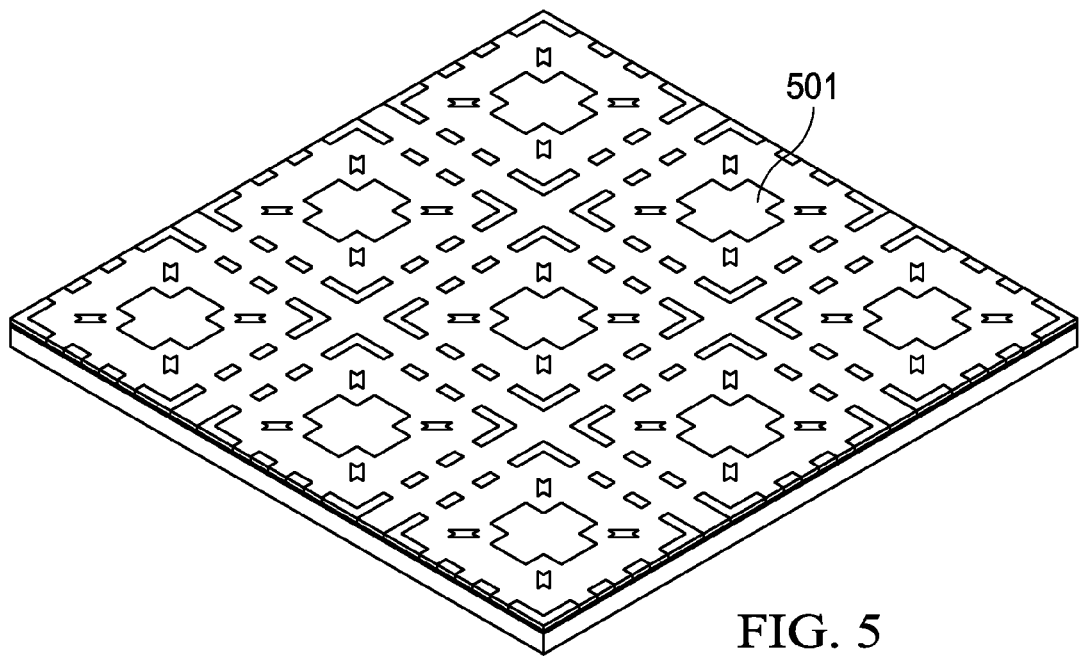

In FIG. 5, the process step of depositing a top electrode on the conductive polymeric compound of the capacitor areas (the open areas of mask 301) is depicted. The top electrode is made of a second metal; examples are areas 510, 511 and 512 in FIG. 5. Preferably, the second metal is bondable to ball and stitch bonds. A preferred choice for the second metal is silver; alternatively, copper with an outermost layer of a bondable metal like palladium may be used.

Figure 6:
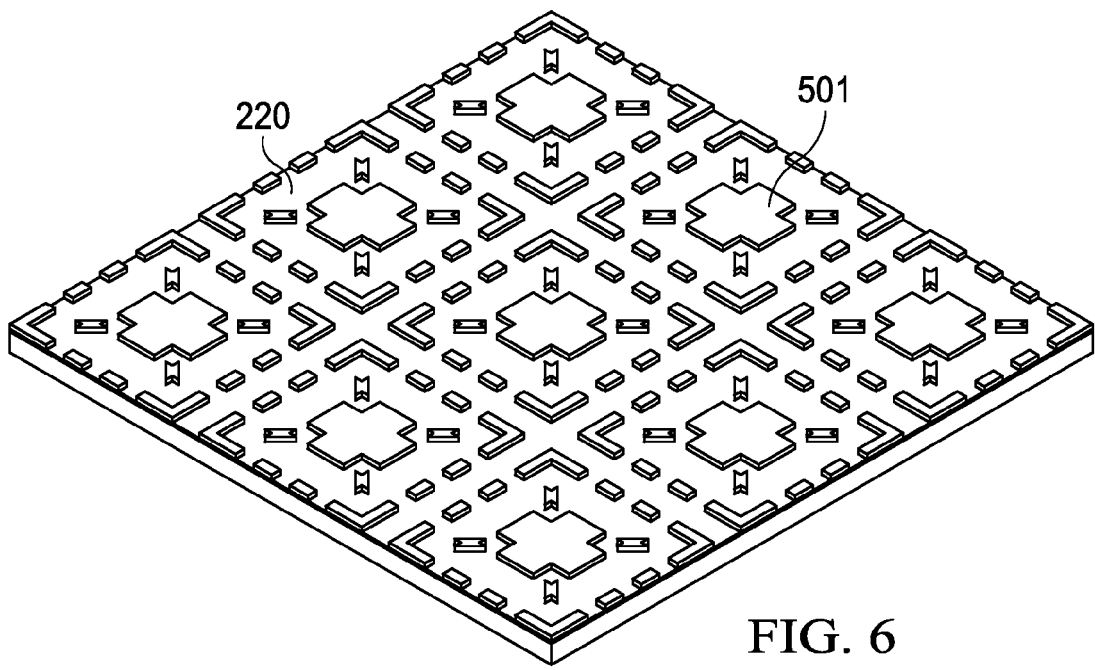
Figure 7:
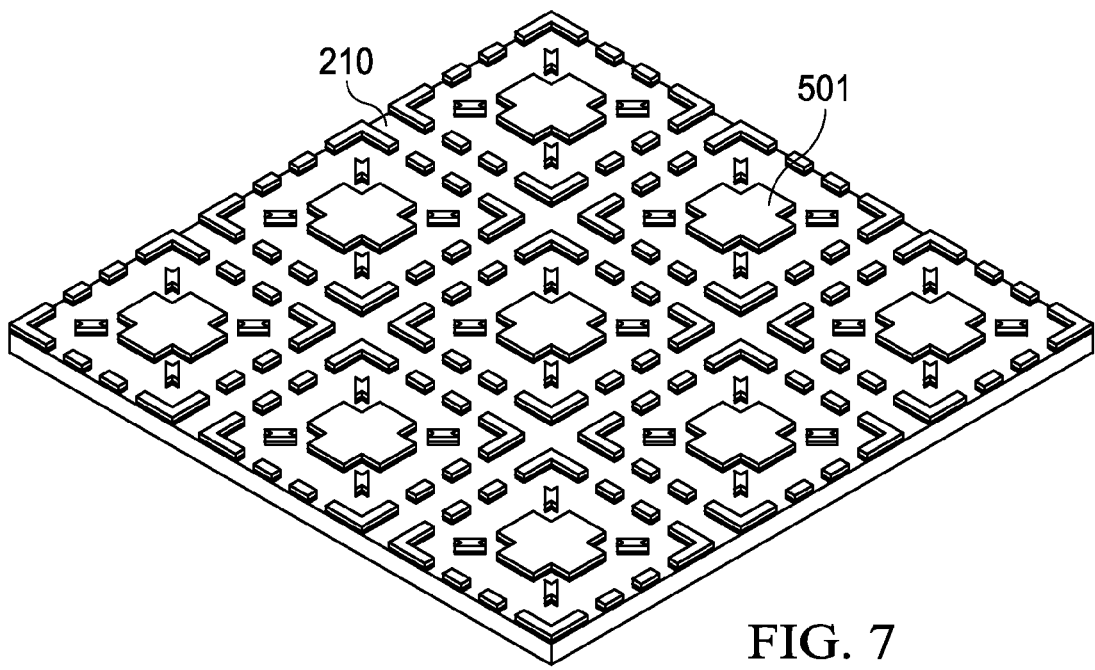

When mask 301 is removed in FIG. 6, the porous conductive material of foil 220 (un-oxidized material) is exposed next to the patterns of second metal (510, 511, 512) of FIG. 5. Protected by the second metal, the capacitor areas stay untouched, when, in the next step (FIG. 7), the exposed porous conductive material 220 is removed. The preferred removal technique is chemical etching, which is selected to specifically attack the porous conductive material 220. In this etching step, the complete thickness of foil 220 is removed so that the underlying first metal 210 becomes exposed (see FIG. 7). The areas of the capacitors, protected by the second metal, are elevated relative to the area of the exposed first metal. The sidewalls of the capacitors, composed of porous conductive material overlaid by conductive polymer and second metal, stand out from the flat surface plane of strip 210 of the first metal.

Figure 8:
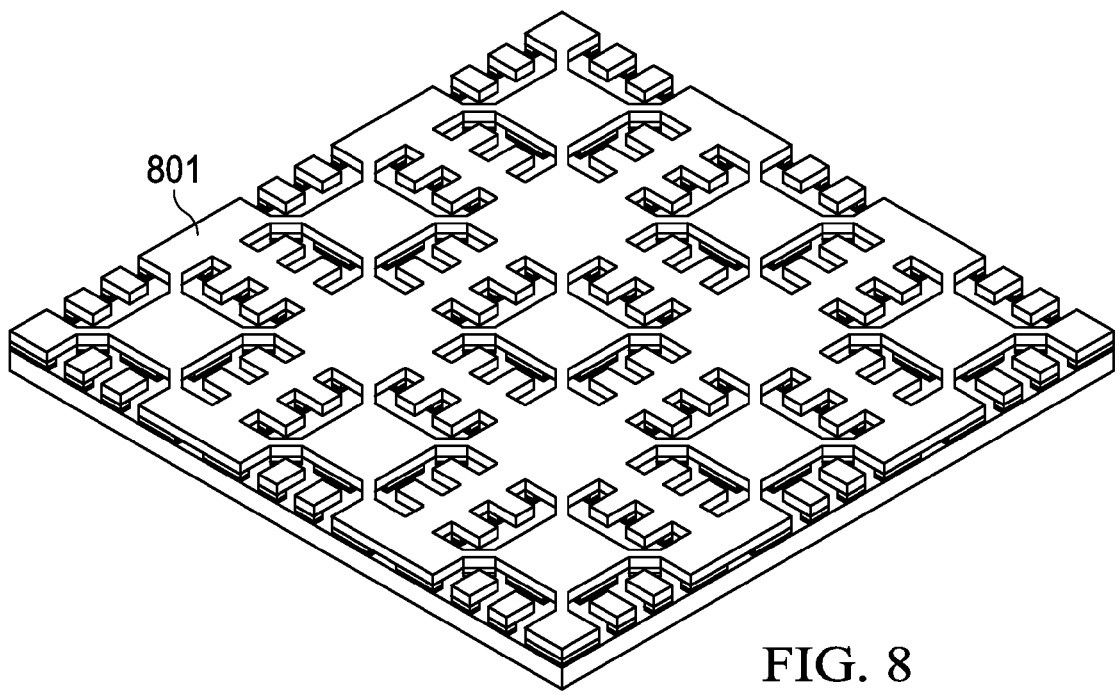

In the next process step, indicated in FIG. 8, a second mask 801 is placed on the first and second metals exposed by the strip. Second mask 801 defines the areas of the leadframe components. As FIG. 8 illustrates, second mask 801 covers all areas of second metal 501 and additional area portions of first metal 210, leaving only remaining portions of first metal 210 exposed for removal. As for the sidewalls of many structures of mask 801, the mask sidewalls are coplanar with sidewalls of capacitors constituted by porous conductive material overlaid by conductive polymeric compound and second metal.

Figure 9:
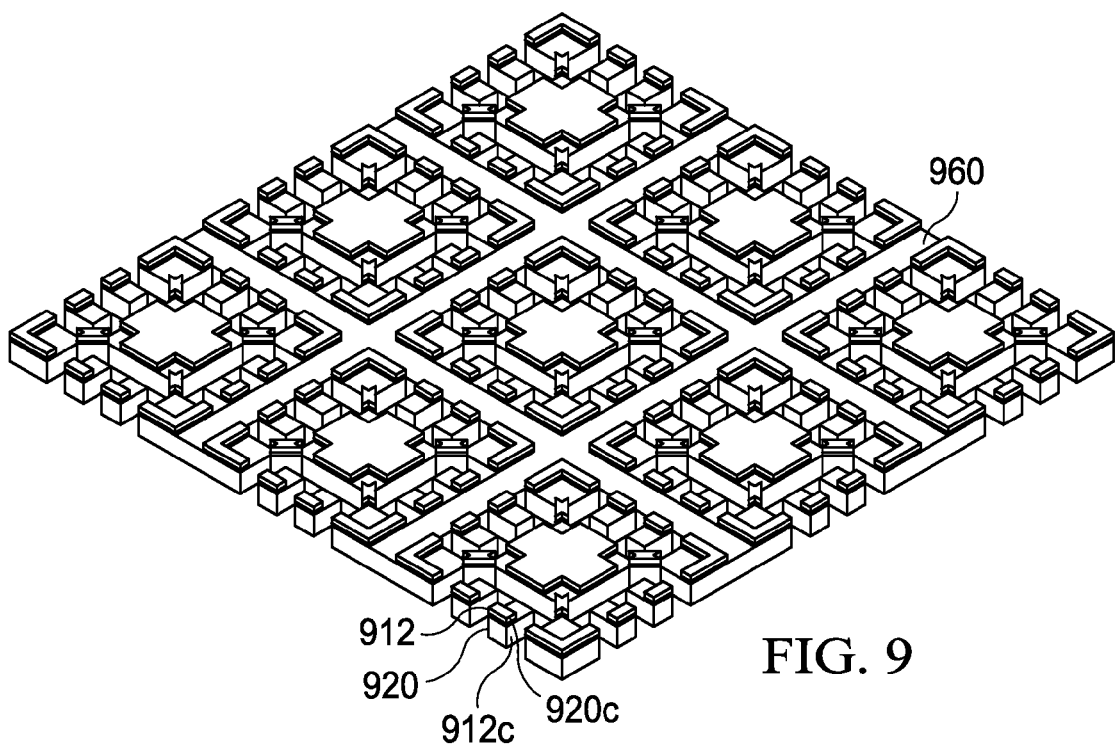

The step of removing the complete thickness of the first metal strip 210 in areas exposed by second mask 801 is depicted in FIG. 9 after removing second mask 801. The preferred method of removal is chemical etching, wherein the etchant is selected to specifically attack metal 210, which had been selected as leadframe metal. In the course of the etching process, the mask-protected areas become leadframe components, such as chip pad and leads; an example is lead 912 in FIG. 9. The leadframe components have sidewalls; for example, lead 912 has sidewall 912c. Wherever the leadframe components are overlaid by capacitors under mask 801, the sidewalls of the leadframe components necessarily become coplanar with the sidewalls of the capacitors. For instance, lead 912 is overlaid by capacitor 920, which has a sidewall 920c. Due to the masking and etching steps described above, lead sidewall 912c is coplanar with capacitor sidewall 920c. As FIG. 9 shows, the etching step has not removed certain traces of metal 210, which, after removal of mask 801, become as saw streets 960 between the plurality of leadframes.

Figure 10:
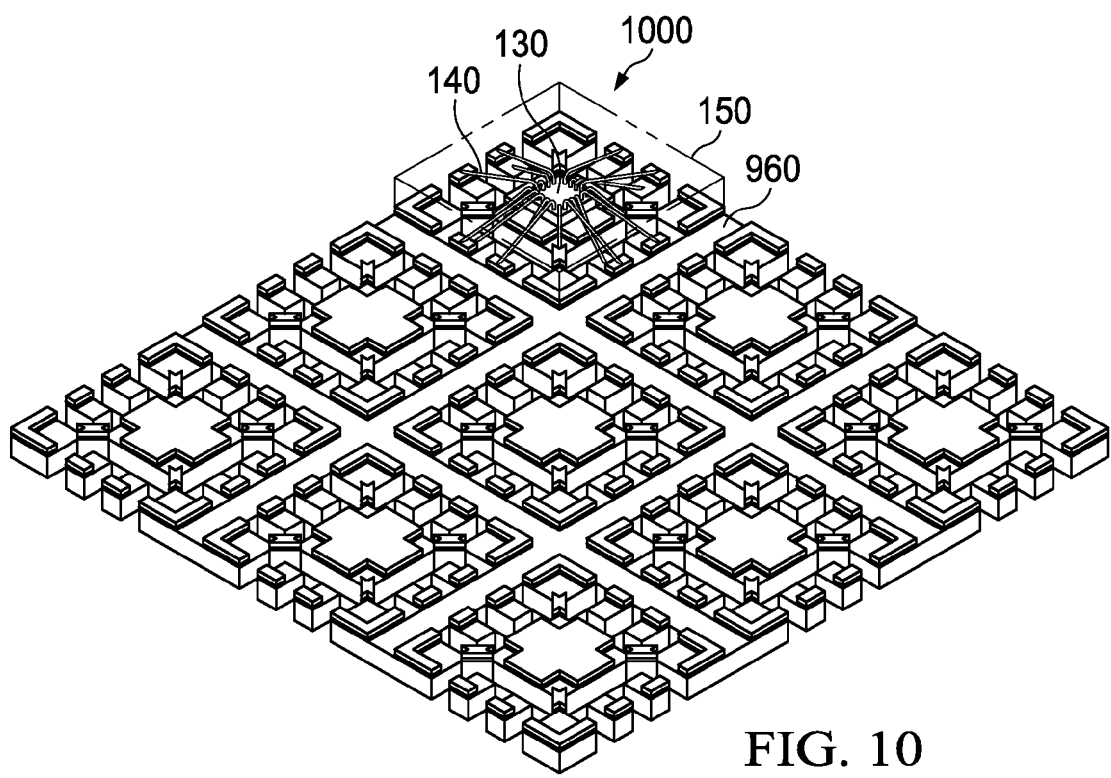

Using a specific leadframe unit 1000 as example, FIG. 10 summarizes additional process steps; the steps include: Attaching a semiconductor chip 130 on the second metal surface of the capacitor on the chip pad of the leadframe unit. Thereafter, spanning wires 140 to connect chip terminals to respective leads of the leadframe and to bondable second metal surfaces of capacitors. Packaging chips, wires, and capacitors in an encapsulation compound 150, preferably a polymeric molding compound. Compound 150 leaves the saw streets 960 outside the polymeric package. In the final process step, the strip of FIG. 10 is sawed along the saw streets in order to singulate the packaged devices from the strip of first metal. Alternatively, a trimming step may be used to break the strip along the saw streets into discreet units.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to integrated circuits, but also to devices with any type of semiconductor chip. The invention also applies to devices without capacitor formed under the chip.

As another example, the method can be extended to capacitors of an arbitrary number and any geometrical shape. The capacitors may not be connected by bonding wires for a specific device type, but may be included in the circuitry for another device type using the same leadframe, thus avoiding any waiting time for leadframe redesign and delivery.

As another example, the capacitance value of capacitors may be modified by varying the process of creating the porous structure, thus allowing to use the same geometrical capacitor values yet with different capacitance values—an inexpensive way of using available package structures with different electrical values.

In yet another example, the metals, insulators, geometries and thicknesses of the capacitors can be selected as a function of the size of the chip so that specific product goals of the assembled package can be achieved such as final thickness, mechanical strength, minimum warpage, prevention of cracking, compatibility with pick-and-place machines, and minimum electrical parasitics.

It is therefore intended that the appended claims encompass any such modifications or embodiments.

We claim:

1. A packaged semiconductor device comprising:
    a leadframe made of a first metal, the leadframe having structures with surfaces and sidewalls; and
    capacitors attached to surface portions of the leadframe structures, the capacitors comprising:
        sidewalls coplanar with structure sidewalls;
        a conductive material attached to a structure surface, the conductive material having pores covered by oxide and filled with conductive polymer; and
        an electrode top made of a second metal.

2. The device of claim 1 wherein the conductive material is a foil.

3. The device of claim 1 wherein the leadframe structures include a chip pad and a plurality of leads.

4. The device of claim 1 wherein the conductive material is selected from a group comprising aluminum, tin, doped silicon, and doped germanium.

5. The device of claim 1 wherein the first metal is selected from a group comprising copper, copper alloys, aluminum, and iron-nickel alloys.

6. The device of claim 1 wherein the second metal is selected from a group comprising silver, copper, and alloys thereof.

7. The device of claim 1 further including a semiconductor chip having bond pads, metal wires connecting the bond pads to leadframe leads, and a packaging compound encapsulating the chip, the wires, the capacitors, and portions of the leads.

8. A leadframe comprising:
a first metal;
a plurality of structures with surface portions and sidewalls; and
a conductive material having a plurality of pores are attached to surface portions of the structures, the plurality of pores including a plurality of surfaces inside of the pores are covered by oxide and filled with conductive polymer, the pores having sidewalls coplanar with structure sidewalls;
the pores topped by an electrode made of a second metal.

9. The device of claim 8 wherein the conductive material is a foil.

10. The device of claim 8 wherein the structures include a chip pad and a plurality of leads.

11. The device of claim 9 wherein the foil is selected from a group comprising aluminum, tin, doped silicon, and doped germanium.

12. The device of claim 8 wherein the first metal is selected from a group comprising copper, copper alloys, aluminum, and iron-nickel alloys.

13. The device of claim 9 wherein the second metal is selected from a group comprising silver, copper, and alloys thereof.

14. The device of claim 9 further including a semiconductor chip having bond pads, metal wires connecting the bond pads to a plurality of leads, and a packaging compound encapsulating the chip, the wires, the capacitors, and portions of the leads.

* * * * *